(12) United States Patent
Wang et al.

(10) Patent No.: US 6,184,128 B1
(45) Date of Patent: Feb. 6, 2001

(54) METHOD USING A THIN RESIST MASK FOR DUAL DAMASCENE STOP LAYER ETCH

(75) Inventors: Fei Wang, San Jose; Christopher F. Lyons, Fremont; Khanh B. Nguyen, San Mateo; Scott A. Bell, San Jose; Harry J. Levinson, Saratoga; Chih Yuh Yang, San Jose, all of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/497,222

(22) Filed: Jan. 31, 2000

(51) Int. Cl.[7] .................................................. H01L 21/4763
(52) U.S. Cl. ..................... 438/637; 438/624; 438/633; 438/634; 438/638; 438/782
(58) Field of Search .................................... 438/624, 633, 438/634, 637, 638, 782

(56) References Cited

U.S. PATENT DOCUMENTS

| 5,431,773 | 7/1995 | Ikeda et al. ............................. 216/23 |
| 5,447,887 | 9/1995 | Filipiak et al. ....................... 437/200 |
| 5,550,405 | 8/1996 | Cheung et al. ....................... 257/642 |
| 5,612,254 | 3/1997 | Mu et al. ............................... 437/195 |
| 5,661,052 | 8/1997 | Inoue et al. ........................... 438/303 |
| 5,674,787 | 10/1997 | Zhao et al. .......................... 437/230 |
| 5,700,737 | 12/1997 | Yu et al. ............................... 438/636 |
| 5,705,430 | 1/1998 | Avanzino et al. .................... 437/195 |
| 5,739,579 | 4/1998 | Chiang et al. ........................ 257/635 |
| 5,759,906 | 6/1998 | Lou ...................................... 438/623 |
| 6,037,664 | * 3/2000 | Zhao et al. ............................ 257/758 |
| 6,042,999 | * 3/2000 | Lin et al. .............................. 430/316 |
| 6,051,508 | * 4/2000 | Takase et al. ......................... 438/724 |
| 6,054,384 | * 4/2000 | Wang et al. .......................... 438/637 |
| 6,063,711 | * 5/2000 | Chao et al. ........................... 438/724 |
| 6,080,663 | * 6/2000 | Chen et al. ........................... 438/637 |
| 6,093,632 | * 7/2000 | Lin ....................................... 438/618 |
| 6,100,184 | * 8/2000 | Zhao et al. ........................... 438/638 |
| 6,103,617 | * 8/2000 | Yoon et al. ........................... 438/624 |

* cited by examiner

*Primary Examiner*—John F. Niebling
*Assistant Examiner*—Lynne Gurley
(74) *Attorney, Agent, or Firm*—Amin, eschweiler & Turocy, LLP

(57) ABSTRACT

In one embodiment, the present invention relates to a dual damascene method involving the steps of providing a substrate having a first low k material layer; forming a first hard mask layer over the first low k material layer; patterning a first opening having a first width in the first hard mask layer using a first photoresist thereby exposing a portion of the first low k material layer; removing the first photoresist; depositing a second low k material layer over the patterned first hard mask layer and the exposed portion of the first low k material layer; forming a second hard mask layer over the second low k material layer; patterning a second opening having a width larger than the first width in the second hard mask layer using a second photoresist thereby exposing a portion of the second low k material layer; anisotropically etching the exposed portions of the first and second low k material layers; and removing the second photoresist, wherein and at least one of the first photoresist and the second photoresist have a thickness of about 1,500 Å or less.

20 Claims, 4 Drawing Sheets

METHOD USING A THIN RESIST MASK FOR DUAL DAMASCENE STOP LAYER ETCH

TECHNICAL FIELD

The present invention generally relates to processing a semiconductor substrate. In particular, the present invention relates to methods of forming trenches, holes and interconnects using a dual damascene process.

BACKGROUND ART

Conventional semiconductor devices typically comprise a semiconductor substrate, normally made of monocrystalline silicon, and a plurality of dielectric and conductive layers formed thereon. An integrated circuit is formed containing a plurality of conductive patterns comprising conductive lines separated by interwiring spacings, and a plurality of interconnect lines, such as bus lines, bit lines, word lines and logic interconnect lines. Such interconnection lines, made of metal interconnect materials, generally constitute a limiting factor in terms of size (width) and various functional characteristics of the integrated circuit. As such, there exists a need to provide a reliable interconnection structure having a small size yet capable of achieving higher operating speeds, improved signal-to-noise ratio and improved reliability.

Using a dual damascene process, semiconductor devices are patterned with several thousand openings for conductive lines and vias which are filled with a conductive metal, such as aluminum or copper, and serve to interconnect the active and/or passive elements of the integrated circuit. The dual damascene process also is used for forming the multilevel signal lines of conductive metal in the insulating layers of multilayer substrate on which semiconductor devices are mounted.

Damascene (single damascene) is an interconnection fabrication process in which grooves are formed in an insulating layer and filled with metal to form the conductive lines. Dual damascene is a multi-level interconnection process in which, in addition to forming the grooves of single damascene, the conductive via openings also are formed. In the standard dual damascene process, the insulating layer is coated with a resist material which is exposed to a first mask with the image pattern of the via openings and the pattern is anisotropically etched in the upper half of the insulating layer. After removal of the patterned resist material, the insulating layer is coated with a resist material which is exposed to a second mask with the image pattern of the conductive lines in alignment with the via openings. In anisotropically etching the openings for the conductive lines in the upper half of the insulating material, the via openings already present in the upper half are simultaneously etched in the lower half of the insulating material. After the etching is complete, both the vias and grooves are filled metal.

Dual damascene is an improvement over single damascene because it permits the filling of both the conductive grooves and vias with metal at the same time, thereby eliminating process steps. Although standard dual damascene offers advantages over other processes for forming interconnections and it has a number of disadvantages and problems. For example, the edges of the via openings in the lower half of the insulating layer are not only poorly defined because there are two etching steps; but also because the via edges are unprotected during the second etching. Thus, improvements are needed in the standard dual damascene process to eliminate the poor edge definition of the via openings.

Another problem associated with edge definition of the via openings is illustrated in FIG. 8. This problem is frequently encountered when an low k materials are employed in the semiconductor device. In particular, FIG. 8 shows the poor sidewall profile due to undesirable over-etching of the insulating material when the photoresist is removed or stripped. This is commonly referred to as undercutting. Undercutting is often caused when removing or stripping conventional photoresists from substrates during dual damascene processing. While the undesirable over-etching is shown in connection with the via, the same problem may occur with the trench. The over-etching leads to malformed metal vias and/or trenches as well as the trapping of air between the metal via (and/or trench) and the insulating material. This consequently degrades the electrical properties of the resultant electronic devices.

In processes where transparent layers are employed, especially in instances where transparent layers are employed over reflective layers, it is difficult to adequately pattern (for example, due to poor critical dimension control and/or undercutting). As a result, antireflection (ARC) layers may be employed. But ARCs tend to unnecessarily complicate the processing. T is therefore desirable to improve printability of photoresists while eliminating the use of ARCs.

SUMMARY OF THE INVENTION

The present invention provides dual damascene methods useful with low k insulation materials. The present invention also provides methods of processing semiconductors having low k insulation materials while not deleteriously effecting the low k insulation materials (that is, by not causing undercutting of the low k insulation layers). The present invention provides methods of adequately forming interconnects and using short wavelength light and/or ultra-thin photoresists. The present invention involves forming high quality interconnects and thus provides methods of forming electronic devices having desirable electrical properties. In particular, the sidewalls of trenches and vias formed during a dual damascene process according to the present invention are of high quality in that they do not exhibit undesirable bowing, air trapping or other deformities. The trenches and vias formed during a dual damascene process according to the present invention are of high quality because of the improved printability when using short wavelength light and/or ultra-thin photoresists. Another advantage obtainable with the present invention is that it is not necessary to use ARCs, especially where insulation layers containing silicon nitride are employed.

In one embodiment, the present invention relates to a dual damascene method involving the steps of providing a substrate having a first low k material layer; forming a first hard mask layer over the first low k material layer; patterning a first opening having a first width in the first hard mask layer using a first photoresist thereby exposing a portion of the first low k material layer; removing the first photoresist; depositing a second low k material layer over the patterned first hard mask layer and the exposed portion of the first low k material layer; forming a second hard mask layer over the second low k material layer; patterning a second opening having a width larger than the first width in the second hard mask layer using a second photoresist thereby exposing a portion of the second low k material layer; anisotropically etching the exposed portions of the first and second low k material layers; and removing the second photoresist, wherein and at least one of the first photoresist and the second photoresist have a thickness of about 1,500 Å or less.

In another embodiment, the present invention relates to a dual damascene method involving the steps of providing a substrate having a first low k material layer; forming a first hard mask layer over the first low k material layer; patterning a first opening having a first width in the first hard mask layer using a first ultra-thin photoresist having a thickness of about 1,500 Å or less thereby exposing a portion of the first low k material layer; removing the first ultra-thin photoresist; depositing a second low k material layer over the patterned first hard mask layer and the exposed portion of the first low k material layer; forming a second hard mask layer over the second low k material layer; patterning a second opening having a width larger than the first width in the second hard mask layer using a second ultra-thin photoresist having a thickness of about 1,500 Å or less thereby exposing a portion of the second low k material layer; anisotropically etching the exposed portions of the first and second low k material layers to form a dual damascene opening; removing the second ultra-thin photoresist; and filling the dual damascene opening with a conductive material.

In yet another embodiment, the present invention relates to a dual damascene method involving providing a substrate having a first low k material layer; forming a first hard mask layer over the first low k material layer; patterning a first opening having a first width in the first hard mask layer using a first photoresist having a thickness of about 1,250 Å or less thereby exposing a portion of the first low k material layer; removing the first photoresist; depositing a second low k material layer over the patterned first hard mask layer and the exposed portion of the first low k material layer; forming a second hard mask layer over the second low k material layer; patterning a second opening having a width larger than the first width in the second hard mask layer using a second photoresist having a thickness of about 1,250 Å or less thereby exposing a portion of the second low k material layer; anisotropically etching the exposed portions of the first and second low k material layers to form a dual damascene opening; removing the second photoresist; and filling the dual damascene opening with a conductive material.

DISCLOSURE OF INVENTION

Figure 1:
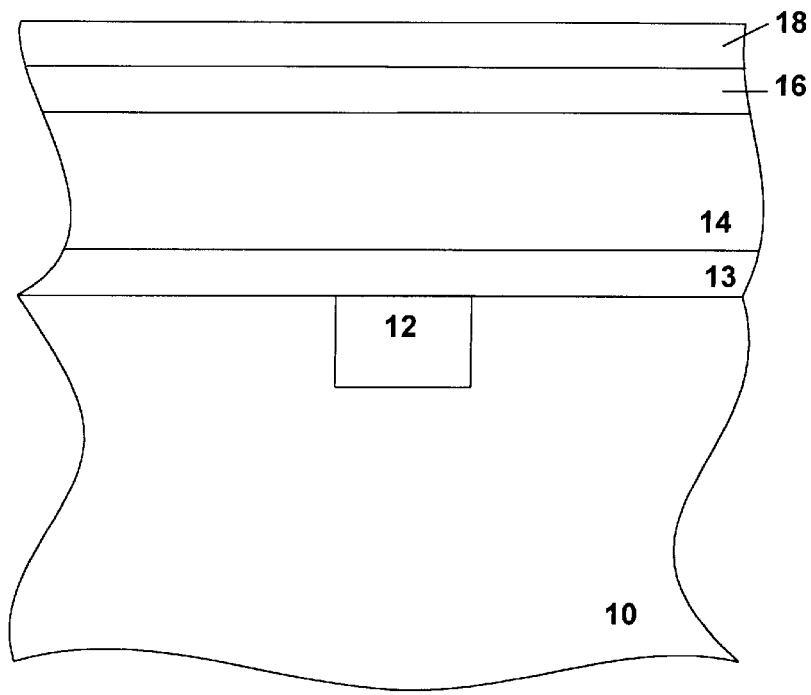
FIG. 1 illustrates a cross-sectional view of a semiconductor substrate having a low k material layer and a photoresist layer according to one aspect of the present invention.

The present invention involves forming high quality, well defined vias, trenches, and other types of interconnect recesses in semiconductor devices containing low k polymer materials using short wavelength light and/or ultra-thin photoresists. The vias and trenches are well defined in that the sidewalls are perpendicular or substantially perpendicular to the horizontal plane of the substrate. In other words, poor sidewall definition is eliminated or minimized by the present invention. The present invention thus provides improved dual damascene methods for substrates containing at least one low k polymer material layer by using ultra-thin photoresists.

Low k polymer materials are insulation materials and include polyimides, fluorinated polyimides, polysilsequioxane, benzocyclobutene (BCB), parlene F, parlene N and amorphous polytetrafluoroethylene. A specific example of a commercially available low k polymer material is Flare™ from AlliedSignal believed to be derived from perfluorobiphenyl and aromatic bisphenols. Low k polymer materials provide electrical insulation between various layers, devices and regions within semiconductor substrates.

Ultra-thin photoresists are employed as masks for protecting selected regions of the semiconductor device during the etching steps. Ultra-thin photoresists in accordance with the present invention have a thickness of about 1,500 Å or less during certain processing steps. In one embodiment, the ultra-thin photoresist layer has a thickness from about 500 Å to about 1,500 Å. In another embodiment, the ultra-thin photoresist layer has a thickness from about 600 Å to about 1,250 Å (about 1,250 Å or less). In yet another embodiment, the ultra-thin photoresist layer has a thickness from about 700 Å to about 1,100 Å (about 1,100 Å or less).

The ultra-thin photoresist layer has a thickness suitable for functioning as a mask for etching the underlying layer including underlying low k material layers and for forming patterns or openings in the developed ultra-thin photoresist layer that are about 0.1 $\mu$m or less and even about 0.05 $\mu$m or less. Since the ultra-thin photoresist layer is relatively thin compared with conventionally used I-line and other photoresists, improved critical dimension control is realized. Moreover, the ultra-thin photoresist layer has a thickness such that removal or stripping of the photoresist does not adversely effect the etched and exposed low k material layer.

Ultra-thin resists are processed using small wavelength radiation. As used herein, small wavelength radiation means electromagnetic radiation having a wavelength of about 365 nm or less. In one embodiment, small wavelength radiation includes electromagnetic radiation having a wavelength of about 250 nm or less. In another embodiment, small wavelength radiation includes extreme UV electromagnetic radiation having a wavelength of about 160 nm or less. In yet another embodiment, small wavelength radiation includes extreme UV electromagnetic radiation having a wavelength of about 15 nm or less.

Small wavelength radiation increases precision and thus the ability to improve critical dimension control. Specific examples of wavelengths to which the ultra-thin photoresists are sensitive (undergo chemical transformation enabling subsequent development) include about 365 nm, about 248 nm, about 193 nm, about 157 nm, about 13 nm, about 11 nm, and about 1 nm. Specific sources of radiation include KrF excimer lasers having a wavelength of about 248 nm, a XeHg vapor lamp having a wavelength from about 200 mn to about 250 nm, mercury-xenon arc lamps having a wavelength of about 248 nm, an ArF excimer laser having a wavelength of about 193 nm, an $F_2$ excimer laser having a wavelength of about 157 nm, extreme UV light having wavelengths of about 13.5 nm and/or about 11.4 nm, and X-rays having a wavelength of about 1 nm.

In embodiments where the patterns or openings (vias and/or trenches) formed in the developed ultra-thin photoresist layer are from about 0.1 μm to about 0.15 μm, a 157 nm sensitive photoresist or a 193 nm sensitive photoresist is preferably employed. In embodiments where the patterns or openings formed in the developed ultra-thin photoresist layer are about 0.1 μm or less, a 13 nm sensitive photoresist or an 11 nm sensitive photoresist (extreme UV photoresist) is preferably employed.

Positive or negative ultra-thin photoresists may be employed in the methods of the present invention. Examples of ultra-thin photoresists include those containing a partially t-butoxycarbonyloxy substituted poly-p-hydroxystyrene, a novolak, or a polyvinylphenol. Photoresists are commercially available from a number of sources, including Shipley Company, JSR Microelectronics, Kodak, Hoechst Celanese Corporation, and Brewer.

FIGS. 1–7 illustrate one embodiment of the methods of the present invention. With regard to the description in connection with the embodiment of FIGS. 1–7, the term substrate includes not only a semiconductor substrate, such as semiconductor substrate 10, but also any and all layers and structures fabricated over the semiconductor substrate up to the point of processing under discussion.

FIGS. 1–7 illustrate a method in connection with forming interconnections that make electrical contact to a metal structure 12 within a semiconductor substrate 10. However, the method of FIGS. 1–7 may be used to form interconnects for other purposes. For example, the method of FIGS. 1–7 may be adapted to making electrical contacts to various device structures, active elements and passive elements including polysilicon gates, wordlines, source regions, drain regions, bit lines, bases, emitters, collectors, conductive lines, conductive plugs, diffusion regions, etc. The method of FIGS. 1–7 may be used with any suitable semiconductor technology including but not limited to NMOS, PMOS, CMOS, BiCMOS, bipolar, multi-chip modules (MCM) and III–IV semiconductors.

Referring to FIG. 1, a semiconductor substrate 10 having metal structure 12 is provided. Semiconductor substrate 10 may include any suitable semiconductor material, for example, a monocrystalline silicon substrate. Metal structure 12 may be any structure to which an electrical contact is desired, for example, a copper line. An insulation material layer 13, such as silicon nitride, is formed over the substrate 10. The insulation material layer 13 may alternatively include one or more of silicon dioxide, silicon oxynitride, boronitride, silicon boronitride and silicon carbide. The insulation material layer 13 may be formed to any suitable thickness using any suitable technique, for instance, using chemical vapor deposition (CVD) techniques. CVD techniques include low pressure chemical vapor deposition (LPCVD) or plasma enhanced chemical vapor deposition (PECVD). In one embodiment, the thickness of the insulation material layer 13 may range, for example, from about 500 Å to about 2,500 Å. The insulation material layer 13 subsequently serves as an etch stop layer for the later described low K material layers, as well as a barrier layer for the metal structure 12.

A low k material layer 14, such as BCB, is formed over the insulation material 13. The low k material layer 14 may alternatively include one or more of polyimides, fluorinated polyimides, polysilsequioxane, parlene F, parlene N, amorphous polytetrafluoroethylene and Flare™ from AlliedSignal. Low k material layer 14 may be formed to any suitable thickness using any suitable technique that may depend, for instance, on the material or materials used. In the case of BCB, a spin on technique is useful. Also in the case of BCB, the thickness of the low k material layer 14 may range, for example, from about 5,000 Å to about 10,000 Å.

A hard mask layer 16, such as a layer of silicon dioxide, is deposited over the low k material layer 14 using suitable techniques, such as CVD techniques. The hard mask layer 16 may alternatively include one or more of silicon nitride, silicon oxynitride, boronitride, silicon boronitride and silicon carbide. The thickness of the hard mask layer 16 may range, for example, from about 500 Å to about 2,500 Å. In this embodiment, the thickness of the hard mask layer 16 is about 1,000 Å.

An ultra-thin photoresist layer 18 is deposited over the hard mask layer 16. The thickness of the ultra-thin photoresist layer 18 may range, for example, from about 500 Å to about 1,500 Å. In this embodiment, the thickness of the ultra-thin photoresist layer 18 is about 1,000 Å.

Figure 2:
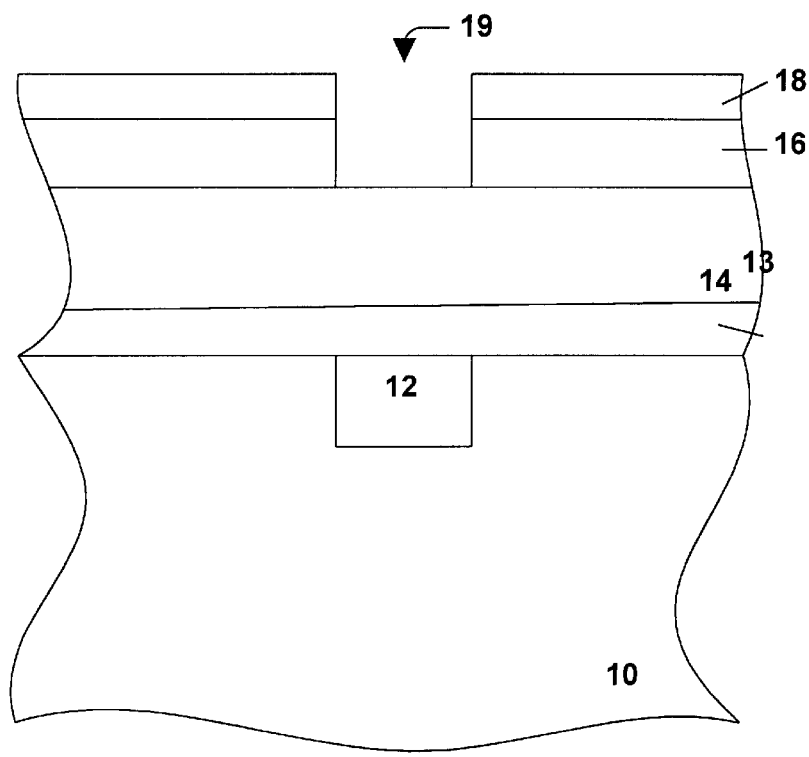
FIG. 2 illustrates a cross-sectional view of the semiconductor substrate of FIG. 1 after patterning of certain layers according to one aspect of the present invention.

Referring to FIG. 2, the ultra-thin photoresist layer 18 and hard mask layer 16 are patterned to define a preliminary contact opening 19 over at least a portion of a device structure, active element or passive element, or the metal structure 12 in this instance. Any suitable patterning technique may be used to define the preliminary contact opening 19 in the ultra-thin photoresist layer 18 and hard mask layer 16. For example, standard photolithographic techniques may be used. In particular, the ultra-thin photoresist layer 18 is exposed to radiation and developed to provide a patterned photoresist. The patterned photoresist is formed using electromagnetic radiation having a relatively small wavelength (for example, less than 365 nm). In this embodiment, electromagnetic radiation having a wavelength of about 11 nm is employed. Either the exposed or unexposed portions of the ultra-thin photoresist layer 18 are removed or developed to provide the patterned photoresist exposing a corresponding portion of the hard mask layer 16 in preliminary contact opening 19.

The exposed portions of the hard mask layer 16 are etched anisotropically to further form preliminary contact opening 19 exposing at least a portion of the low k material layer 14. The patterned ultra-thin photoresist layer 18 may then be stripped from the substrate, and the substrate may be optionally cleaned to remove residue from preliminary contact opening 19. Since the ultra-thin photoresist layer 18 has a thickness about 2,000 Å or less, the stripping process does not materially effect the conformation of the low k material layer 14 or the preliminary contact opening 19.

Preliminary contact opening 19 may be formed to have any desired cross-section, width or diameter, such as about 0.1 μm or less, including about 0.09 μm or less, about 0.075 μm or less and about 0.05 μm or less, primarily depending upon the wavelength of radiation employed. The preliminary contact openings 19 serve to define subsequently formed contact holes.

Figure 3:
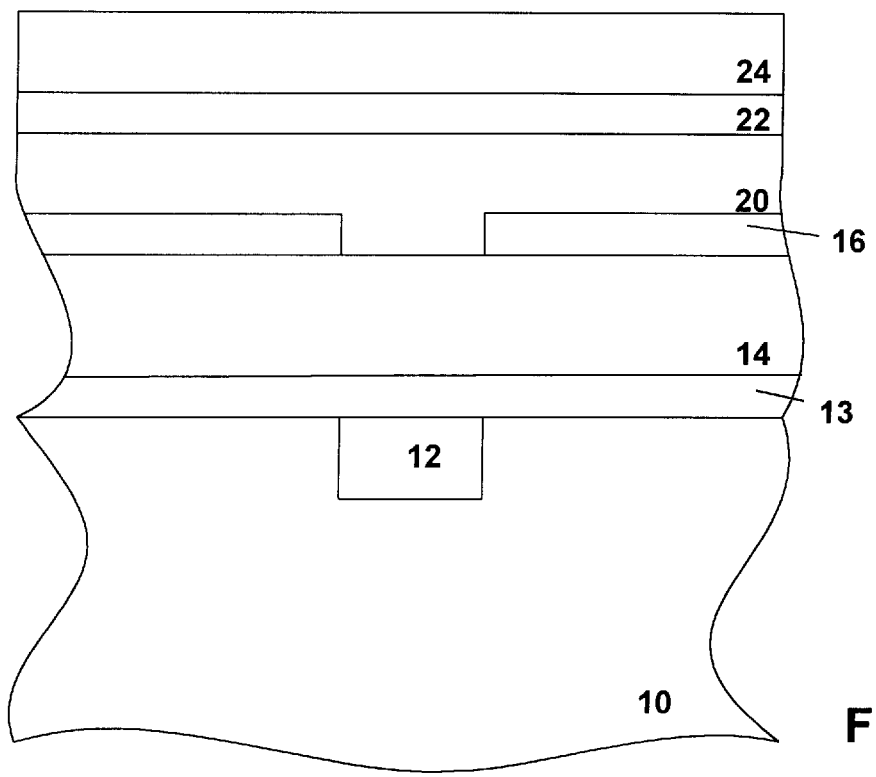
FIG. 3 illustrates a cross-sectional view of the semiconductor substrate of FIG. 2 after another low k material layer is formed according to one aspect of the present invention.

Referring to FIG. 3, a second low k material layer 20 may be formed to any suitable thickness using any suitable technique over the substrate, including over the hard mask layer 16 and the exposed portion of the low k material layer 14 in the preliminary contact opening 19. In this embodiment, another BCB layer is formed by spin on techniques. Also in this embodiment, the thickness of the second low k material layer 20 may range, for example, from about 5,000 Å to about 10,000 Å.

A second hard mask layer 22, such as a layer of silicon dioxide, is deposited over the second low k material layer 20 using suitable techniques, such as CVD techniques. The second hard mask layer 22 may alternatively include one or more of silicon nitride, silicon oxynitride, boronitride, silicon boronitride and silicon carbide. The thickness of the second hard mask layer 22 may range, for example, from about 500 Å to about 2,500 Å. In this embodiment, the thickness of the second hard mask layer 22 is about 1,000 Å.

A second ultra-thin photoresist layer 24 is deposited over the second hard mask layer 22. The thickness of the second ultra-thin photoresist layer 24 may range, for example, from about 500 Å to about 1,500 Å. In this embodiment, the thickness of the second ultra-thin photoresist layer 24 is about 1,000 Å. The second ultra-thin photoresist layer 24 and the second hard mask layer 22 subsequently serve as a trench mask for forming a trench over a plurality of contact holes.

Figure 4:
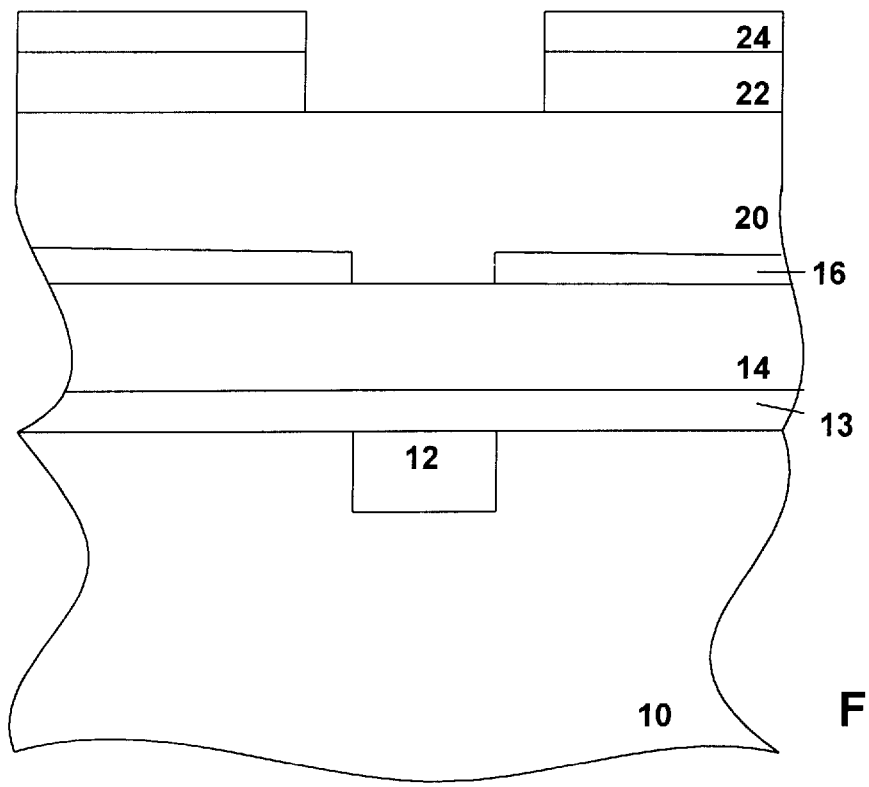
FIG. 4 illustrates a cross-sectional view of the semiconductor substrate of FIG. 3 after patterning of certain layers according to one aspect of the present invention.

Referring to FIG. 4, the second ultra-thin photoresist layer 24 and second hard mask layer 22 are patterned to define a trench mask over at least a portion of a device structure, active element or passive element, or the metal structure 12 in this instance. Any suitable patterning technique may be used to define the trench mask in the second ultra-thin photoresist layer 24 and second hard mask layer 22. For example, standard photolithographic techniques may be used. In particular, the second ultra-thin photoresist layer 24 is exposed to radiation and developed to provide a patterned photoresist. The patterned photoresist is formed using electromagnetic radiation having a relatively small wavelength (for example, less than 365 nm). In this embodiment, electromagnetic radiation having a wavelength of about 11 nm is employed. Either the exposed or unexposed portions of the second ultra-thin photoresist layer 24 are removed or developed to provide the patterned photoresist exposing a corresponding portion of the second hard mask layer 22 in the trench region.

The exposed portions of the second hard mask layer 22 are etched anisotropically to further form the trench exposing at least a portion of the second low k material layer 20. The trench may be formed to have any desired cross-section, width or diameter, such as about 0.25 μm, about 0.18 μm, about 0.15 μm, about 0.13, about 0.1 μm, about 0.075 and/or about 0.05 μm. The width of the trench may depend on the resistivity of the conductive material used for creating an interconnect within the trench. The width of the trench is typically larger than the width of previously described preliminary contact opening 19.

Figure 5:
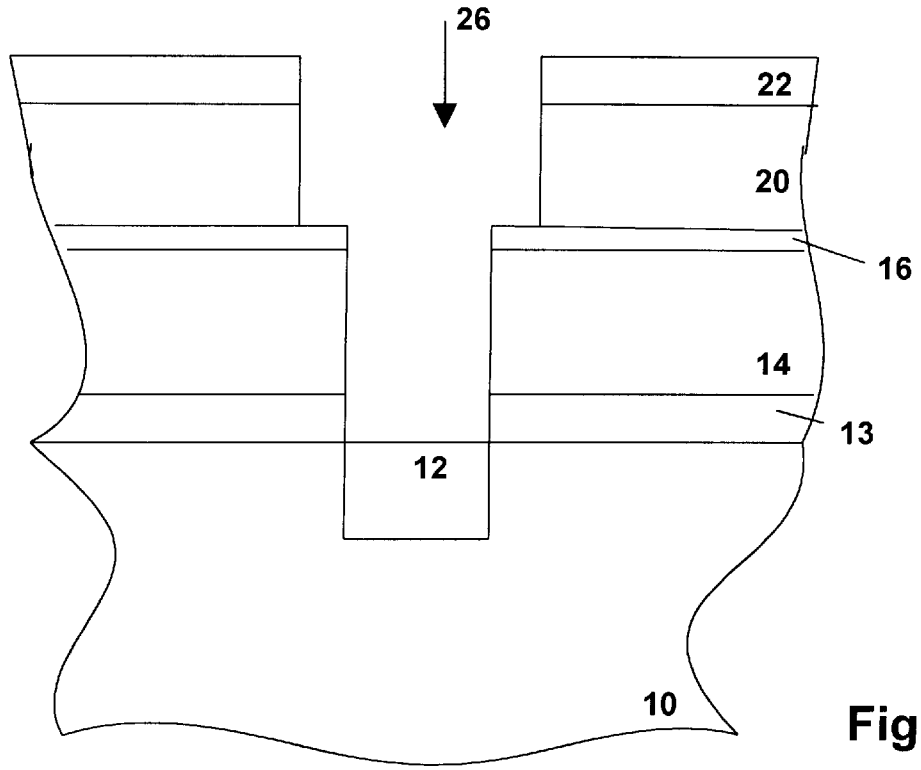
FIG. 5 illustrates a cross-sectional view of the semiconductor substrate of FIG. 4 after a portion of the low k material is removed according to one aspect of the present invention.

Referring to FIG. 5, exposed portions of the second low k material layer 20, low k material layer 14 and insulation material layer 13 are removed in any suitable manner to define an opening 26 comprised of a trench or interconnect channel over at least one contact hole formed over metal structure 12. Any suitable etch technique may be used to etch second low k material layer 20, low k material layer 14 and insulation material layer 13. Preferably, a selective etch technique may be used to etch the material of low k material layers 20 and 14 and at a relatively greater rate as compared to the rate that the material of the insulation material layer 13, second ultra-thin photoresist layer 24, and/or second hard mask layer 22 are etched. In other words, the insulation material layer 13 serves as an etch-stop layer when etching low k material layers 20 and 14. Portions of the low k material layer 14 and second low k material layer 20 are typically etched in an anisotropic manner using an oxygen containing gas exposing a portion of the insulation material layer 13.

The exposed portion of the insulation material layer 13 is etched in an anisotropic manner using a suitable gas mixture, primarily depending upon the composition of the insulation material layer 13 exposing at least a portion of the metal structure 12. The second ultra-thin photoresist layer 24 may then be stripped from the substrate, and the substrate may be optionally cleaned to remove residue from the opening 26. However, since the second ultra-thin photoresist layer 24 has a thickness about 2,000 Å or less, the second ultra-thin photoresist layer 24 is typically removed during removal of portions of the low k material layers 14 and 20 where an oxygen containing gas is used as an etchant. In a preferred embodiment, therefore, the insulation material layer 13 and the second hard mask layer 22 contain different materials to afford etch selectivity.

Figure 6:
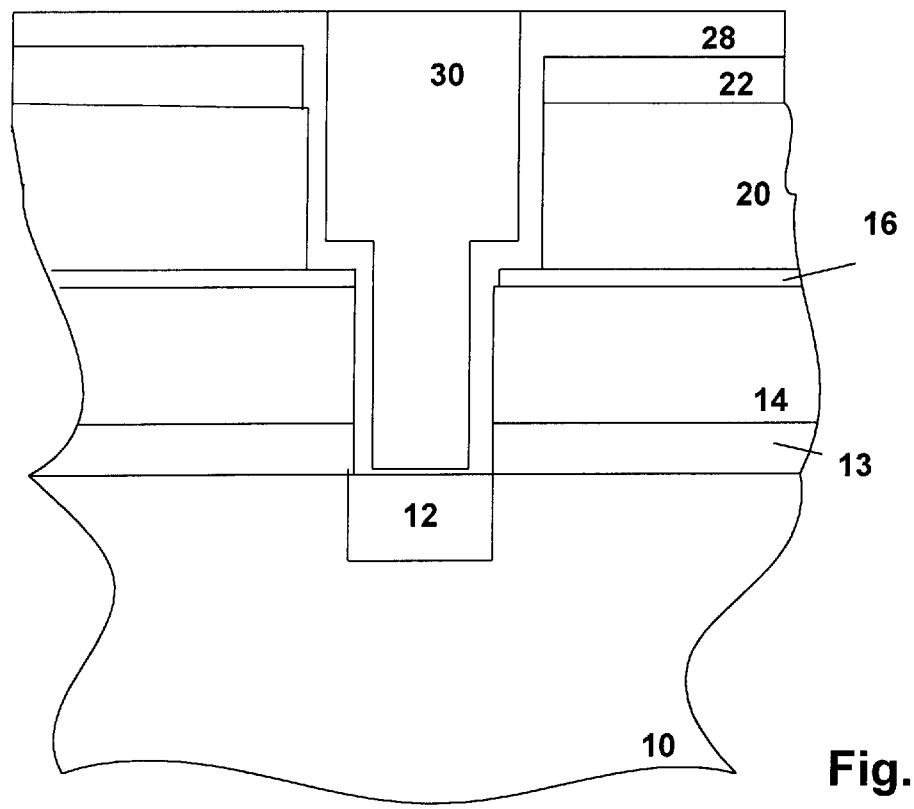
FIG. 6 illustrates a cross-sectional view of the semiconductor substrate of FIG. 5 after a barrier layer and a conductive layer are formed according to one aspect of the present invention.

Referring to FIG. 6, a suitable conductive material or materials is formed or deposited over the substrate, including filling the opening 26 and over the second hard mask layer 22. For example, an optional barrier layer 28 and a conductive layer 30 are deposited over the substrate. The optional barrier layer 28 may serve as a diffusion barrier preventing materials from the conductive layer 30 from diffusing into the low k material layer 14 and/or second low k material layer 20. The optional barrier layer 28 is formed over the substrate so that it covers the side walls and bottom in the opening 26. The barrier layer 28 may be formed using any suitable technique to a thickness sufficient to serve as a diffusion barrier for conductive layer 30. For example, the thickness of the barrier layer 28 may be in the range from about 300 Å to about 500 Å. The barrier layer 28 is a conductive layer containing, for example, tantalum, tungsten, titanium, alloys, silicides, and/or nitrides thereof.

Conductive layer 30 is then formed over the substrate, substantially filling opening 26. The conductive layer may be made of any suitable conductive material or materials. Examples of suitable conductive materials include copper, tungsten, gold, silver, aluminum, any alloys and/or combinations thereof. In this embodiment, the conductive material is copper or a copper alloy. The conductive layer 30 may be formed to any suitable thickness using any suitable technique. For example, the thickness of the conductive layer 30 may range from about 0.1 μm to about 2 μm.

The optional barrier layer 28 and the conductive layer 30 may be deposited using CVD techniques or physical vapor deposition techniques. Alternatively, when copper is used as the conductive layer, the surface of the barrier layer may be activated using copper atoms (copper seeds) by contact displacement followed by the autocatalytic deposition of electrolessly deposited copper.

Figure 7:
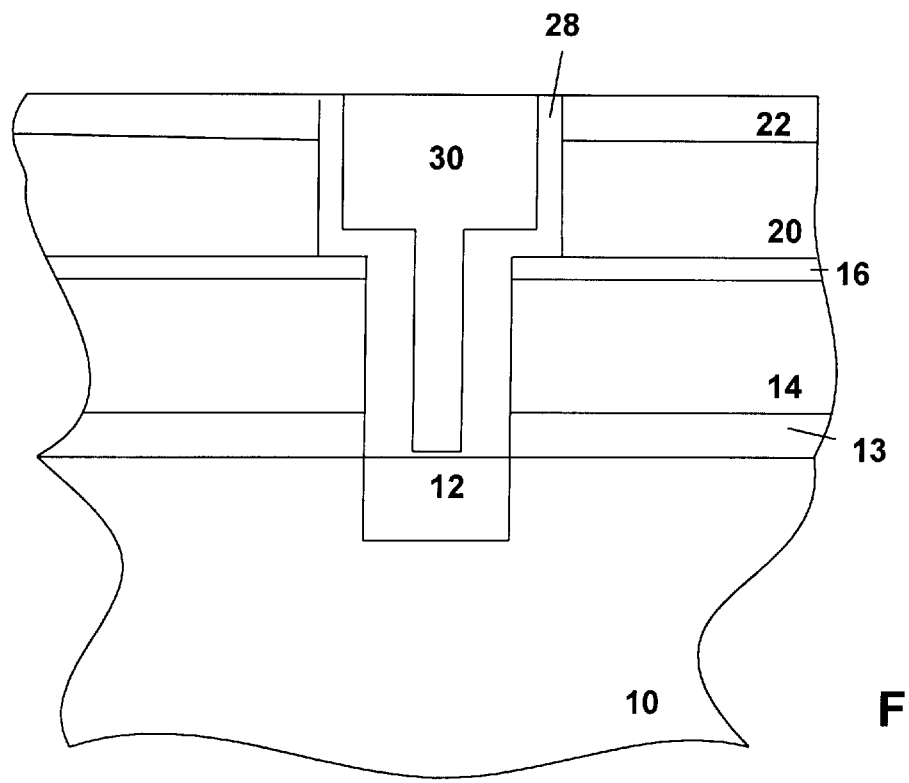
FIG. 7 illustrates a cross-sectional view of the semiconductor substrate of FIG. 6 after the substrate is planarized according to one aspect of the present invention.
Figure 8:
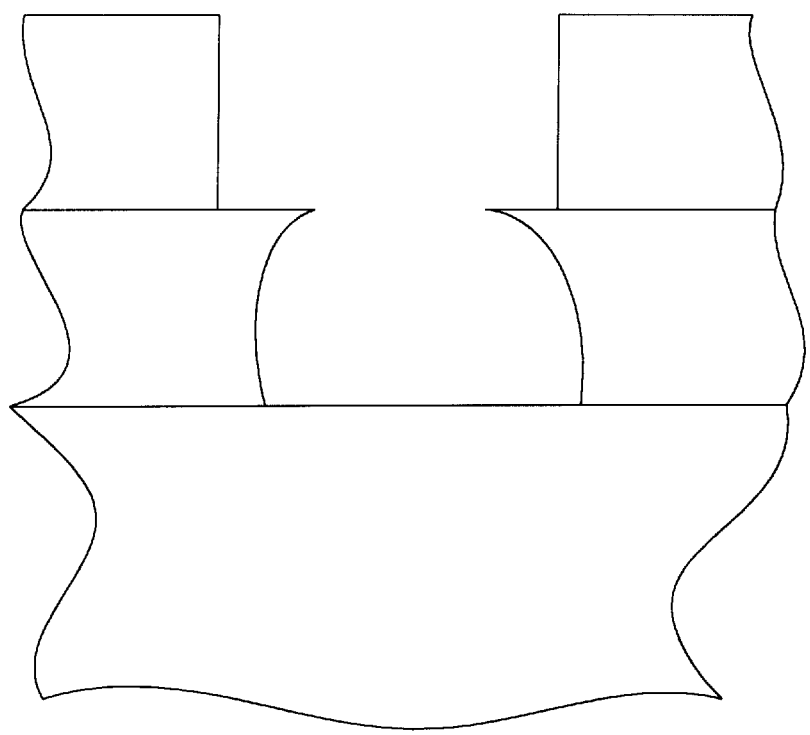
FIG. 8 illustrates a cross-sectional view of a conventional semiconductor substrate during dual damascene processing.

Referring to FIG. 7, conductive layer 30 is planarized to the surface of the barrier layer 28; that is, portions of the conductive layer 30 are removed from the top surface of barrier layer 28 above the second hard mask layer 22. Opening 26 remains substantially filled with the barrier layer 28 and conductive layer 30. Any suitable technique may be used to planarize the substrate and may depend, for instance, on the specific identity of the material used to make the conductive layer 30. In one embodiment, the substrate is planarized (a portion of the conductive layer is removed) using chemical mechanical polishing (CMP) techniques using a polishing solution or slurry depending upon the specific identity of the materials used for the conductive layer 30. As a result of CMP techniques, dishing may occur wherein the conductive layer 30 is removed to a level below the top surface of the barrier layer 28, and in some instances, to a level just below the top surface of the second hard mask layer 22.

The portion of the optional barrier layer 28, if employed, exposed over the second hard mask layer 22 is removed using CMP techniques or an etch gas mixture. After the portion of the barrier layer exposed over the second hard mask layer 22 is removed, the substrate may be cleaned using conventional techniques such as wet cleaning techniques. Removal of the exposed portion of the barrier layer serves to planarize the substrate while leaving undisturbed the portion of the barrier layer 28 surrounding conductive layer 30. If employed, the etch gas mixture has high etch selectivity for the barrier metal as compared to a hard mask material, such as silicon oxide, which may constitute the second hard mask layer 22 as well as other conductive metals such as copper or copper alloys, which may constitute the conductive layer 30. In this embodiment, the etch gas mixture provides a selective etch such that the conductive layer 30 serves as a mask in etching the barrier layer 28. The etch gas mixture etches in an isotropic manner whereby there is no or very little change in side wall profile of the conductive layer 30.

Generally referring to FIGS. 1–7, the methods disclosed herein may be used to create another via layer and another interconnect layer. In fact, it will be appreciated that the method can be used repeatedly to create multilayered structures with numerous via layers and/or interconnect layers.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A dual damascene method comprising:
   providing a substrate having a first low k material layer;
   forming a first hard mask layer over the first low k material layer;
   patterning a first opening having a first width in the first hard mask layer using a first photoresist thereby exposing a portion of the first low k material layer;
   removing the first photoresist;
   depositing a second low k material layer over the patterned first hard mask layer and the exposed portion of the first low k material layer;
   forming a second hard mask layer over the second low k material layer;
   patterning a second opening having a width larger than the first width in the second hard mask layer using a second photoresist thereby exposing a portion of the second low k material layer;
   anisotropically etching the exposed portions of the first and second low k material layers; and
   removing the second photoresist, wherein and at least one of the first photoresist and the second photoresist have a thickness of about 1,500 Å or less.

2. The method of claim 1, wherein the first hard mask layer and the second hard mask layer independently comprise at least one of silicon dioxide, silicon nitride, silicon oxynitride, boronitride, silicon boronitride and silicon carbide.

3. The method of claim 1, wherein the first insulation layer and the second insulation layer independently comprise at least one of polyimides, fluorinated polyimides, polysilsequioxane, benzocyclobutene, parlene F, parlene N and amorphous polytetrafluoroethylene.

4. The method of claim 1, wherein the first photoresist and the second photoresist are independently processed using electromagnetic radiation having a wavelength of about 250 nm or less.

5. The method of claim 1, wherein the photoresist is processed using electromagnetic radiation having a wavelength of about 365 nm or less.

6. The method of claim 1, wherein the exposed portions of the first and second low k material layers are etched with an oxygen containing gas.

7. The method of claim 1, wherein the first width is about 0.1 µm or less and the second width is about 0.25 µm or less.

8. A dual damascene method comprising:
   providing a substrate having a first low k material layer;
   forming a first hard mask layer over the first low k material layer;
   patterning a first opening having a first width in the first hard mask layer using a first ultra-thin photoresist having a thickness of about 1,500 Å or less thereby exposing a portion of the first low k material layer;
   removing the first ultra-thin photoresist;
   depositing a second low k material layer over the patterned first hard mask layer and the exposed portion of the first low k material layer;
   forming a second hard mask layer over the second low k material layer;
   patterning a second opening having a width larger than the first width in the second hard mask layer using a second ultra-thin photoresist having a thickness of about 1,500 Å or less thereby exposing a portion of the second low k material layer;
   anisotropically etching the exposed portions of the first and second low k material layers to form a dual damascene opening;
   removing the second ultra-thin photoresist; and
   filling the dual damascene opening with a conductive material.

9. The method of claim 8, wherein the conductive material comprises at least one of copper, tungsten, gold, silver, aluminum, and alloys thereof.

10. The method of claim 8, wherein the conductive material comprises at least one of copper, tungsten, gold, silver, aluminum, and alloys thereof at least partially surrounded by a barrier layer.

11. The method of claim 8, wherein the first low k material layer and the second low k material layer independently comprise at least one of polyimides, fluorinated polyimides, polysilsequioxane, benzocyclobutene, parlene F, parlene N and amorphous polytetrafluoroethylene.

12. The method of claim 8, wherein the second ultra-thin photoresist is removed during the anisotropic etching of the exposed portions of the first and second low k material layers.

13. The method of claim 8, wherein the first ultra-thin photoresist and the second ultra-thin photoresist independently comprise at least one of a 193 nm sensitive photoresist, a 157 nm sensitive photoresist, a 13 nm sensitive photoresist, and an 11 nm sensitive photoresist.

14. The method of claim 8, wherein the first ultra-thin photoresist has a thickness from about 500 Å to about 1,250 Å and the second ultra-thin photoresist has a thickness from about 500 Å to about 1,250 Å.

15. A dual damascene method comprising:

providing a substrate having a first low k material layer;

forming a first hard mask layer over the first low k material layer;

patterning a first opening having a first width in the first hard mask layer using a first photoresist having a thickness of about 1,250 Å or less thereby exposing a portion of the first low k material layer;

removing the first photoresist;

depositing a second low k material layer over the patterned first hard mask layer and the exposed portion of the first low k material layer;

forming a second hard mask layer over the second low k material layer;

patterning a second opening having a width larger than the first width in the second hard mask layer using a second photoresist having a thickness of about 1,250 Å or less thereby exposing a portion of the second low k material layer;

anisotropically etching the exposed portions of the first and second low k material layers to form a dual damascene opening;

removing the second photoresist; and filling the dual damascene opening with a conductive material.

16. The method of claim 15, wherein the first low k material layer and the second low k material layer independently comprise at least one of polyimides, fluorinated polyimides, polysilsequioxane, benzocyclobutene, parlene F, parlene N and amorphous polytetrafluoroethylene.

17. The method of claim 15, wherein the first low k material layer and the second low k material layer comprise benzocyclobutene.

18. The method of claim 15, wherein the first width is about 0.1 $\mu$m or less and the second width is about 0.25 $\mu$m or less.

19. The method of claim 15, wherein the first hard mask layer and the second hard mask layer independently comprise at least one of silicon dioxide, silicon nitride, silicon oxynitride, boronitride, silicon boronitride and silicon carbide.

20. The method of claim 15, wherein the first hard mask layer and the second hard mask layer comprise at least one of silicon dioxide, silicon nitride, and silicon boronitride.

\* \* \* \* \*